United States Patent

Park

[11] Patent Number: 5,825,321
[45] Date of Patent: Oct. 20, 1998

[54] APPARATUS FOR DETECTING OUTPUT LOAD

[75] Inventor: Sung-Uk Park, Inchun Kwangyok-si, Rep. of Korea

[73] Assignee: Samsung Electronics Co., Ltd., Suwon, Rep. of Korea

[21] Appl. No.: 700,777

[22] Filed: Aug. 22, 1996

[30] Foreign Application Priority Data

Aug. 23, 1995 [KR] Rep. of Korea .................. 1995 26154

[51] Int. Cl.$^6$ .................................................. H03M 1/66
[52] U.S. Cl. ........................................ 341/144; 323/317
[58] Field of Search ............................ 341/144; 323/315, 323/316, 317

[56] References Cited

U.S. PATENT DOCUMENTS 4,814,688  3/1989  Colles ...................................... 323/317
5,221,890  6/1993  Shyu et al. .............................. 323/317

Primary Examiner—Brian K. Young
Attorney, Agent, or Firm—Jones & Volentine, L.L.P.

[57] ABSTRACT

An apparatus for detecting when an output load of a digital-to-analog converter is changed to another value, automatically sensing the converted output load, and supplying a stable current to the output terminal of the digital-to-analog converter. Normally a digital-to-analog converter operated for processing a digital video signal, has two kinds of output loads, 75Ω and 37.5Ω. The apparatus detects whether the output load of the digital analog converter is 75Ω or 37.5Ω, varies output current according to the detected output load, and therefore actively adjusts the video output voltage to be constantly in the range of $1V_{P-P}$.

5 Claims, 2 Drawing Sheets

APPARATUS FOR DETECTING OUTPUT LOAD

BACKGROUND OF THE INVENTION (1) Field of the Invention

The present invention relates to an apparatus for detecting an output load, and more particularly, to an apparatus for detecting when the output load of the digital-to-analog converter changes to another value.

(2) Description of the Prior Art

A digital-to-analog converter is generally used for processing a digital signal, such as a video signal, and outputting a current signal. Typically, two kinds of output loads are connected to such a digital-to-analog converter, 75Ω and 37.5Ω. The output load of 37.5Ω is usually the result of a combined parallel impedance when a monitor or measuring device is connected in parallel to the digital-to-analog converter. In general, the output load of 37.5Ω is achieved when the output terminal of the digital analog converter is directly connected to a monitor without intermediate processing. The output load of 75Ω is achieved when an analog buffering procedure, such as the operation of a low pass filter (LPF), is performed between the output terminal of the digital-to-analog converter and the monitor.

A digital-to-analog converter used in video applications must output appropriate currents so that for each of two output loads an output voltage range of approximately $1V_{P-P}$ (where P—P stands for peak-to-peak) is achieved.

FIG. 1 depicts a conventional digital-to-analog conversion system. As shown in FIG. 1, a conventional digital-to-analog conversion system includes a digital-to-analog converter DAC which receives a digital signal as an input. A reference voltage generating circuit is used to generate a constant voltage. A comparator CP having inverting and non-inverting terminals, is arranged to receive the reference voltage at the non-inverting input terminal. A transistor Q2 having drain, gate, and source terminals, is arranged to receive the output signal of the comparator at its gate terminal. One end of a resistor R is connected to both the source terminal of the transistor Q2 and the inverting terminal of the comparator. The other end of the resistor R is grounded. A transistor Q1 is arranged to receive a supply voltage $V_{DD}$ at its source terminal. The gate and drain terminals of Q1 are commonly connected to the drain terminal of transistor Q2.

Typically a digital-to-analog converter receives digital signals, converts the digital signals to analog signals, and outputs the analog signals. While this operation is carried out, a constant current flows in transistor Q1 based upon an inherent circuit resistance, and voltage is generated from a reference voltage generating circuit. The digital-to-analog converter outputs a current proportional to the constant current in Q1. The current in the transistor Q1 is tracked by that output from the digital analog converter so that the combined circuit forms a current mirror. The output current range of the digital-to-analog converter is determined by the size of the transistor Q1.

However, since the output load of a conventional digital-to-analog converter typically has at least two kinds of output, load is varied. To maintain a constant output voltage range, the range of the output current of the digital-to-analog converter must also be varied.

Conventionally, a video digital-to-analog converter fixes a reference current based upon only one of the two output loads of 75Ω and 37.5Ω. Therefore, if the output load of the digital-to-analog conversion system is changed, both the reference current (through transistor Q1) and the output current must change, necessitating a redesign of Q1 and thus, of the overall system.

SUMMARY OF THE INVENTION

One object of the present invention is to provide a digital-to-analog conversion system that accommodates varying system output loads.

Another object of the present invention is to maintain a constant output voltage for a digital-to-analog conversion system despite varying output loads.

A further object of the present invention is to provide a digital-to-analog conversion system that does not require the redesign normally caused by varying output loads.

These and other objects of the present invention are achieved through the use of a digital-to-analog conversion system arranged to detect an output load. The system includes a digital-to-analog converting device, and a load variation sensing device. The load variation sensing device is arranged to sense a load variation based upon an output signal of the digital-to-analog converting device. Also included is a load current varying device which is arranged to maintain a constant output voltage from the digital-to-analog converting device based upon an output voltage of the load variation sensing device.

DETAILED DESCRIPTION OF THE PREFERRED EMBODIMENT

Figure 1:
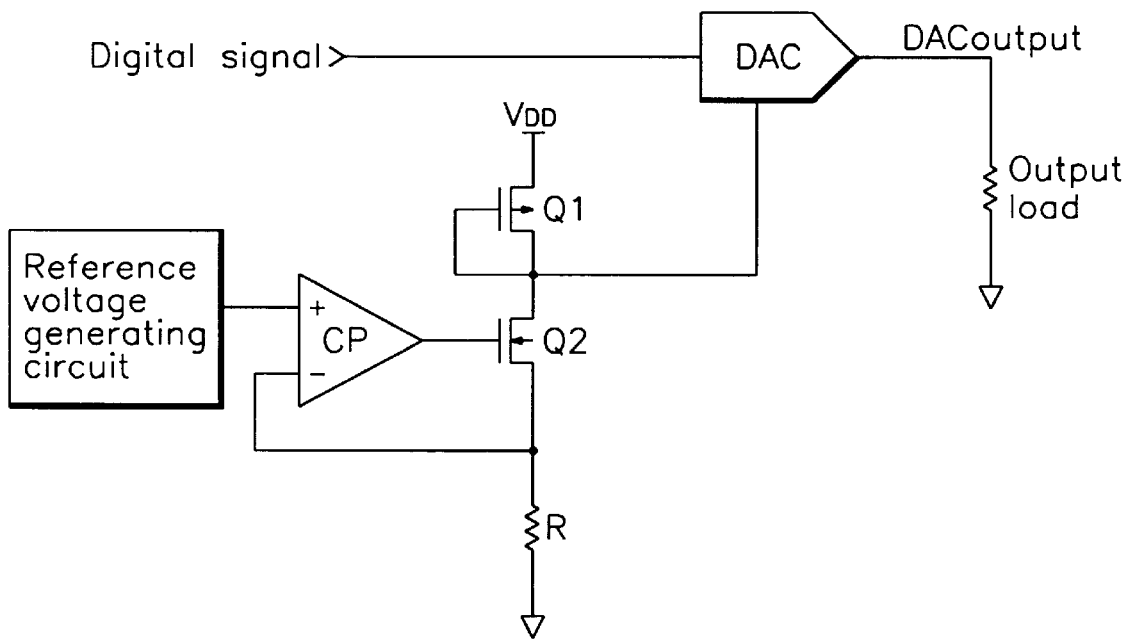
FIG. 1 is a schematic diagram of a conventional digital-to-analog conversion system.
Figure 2:
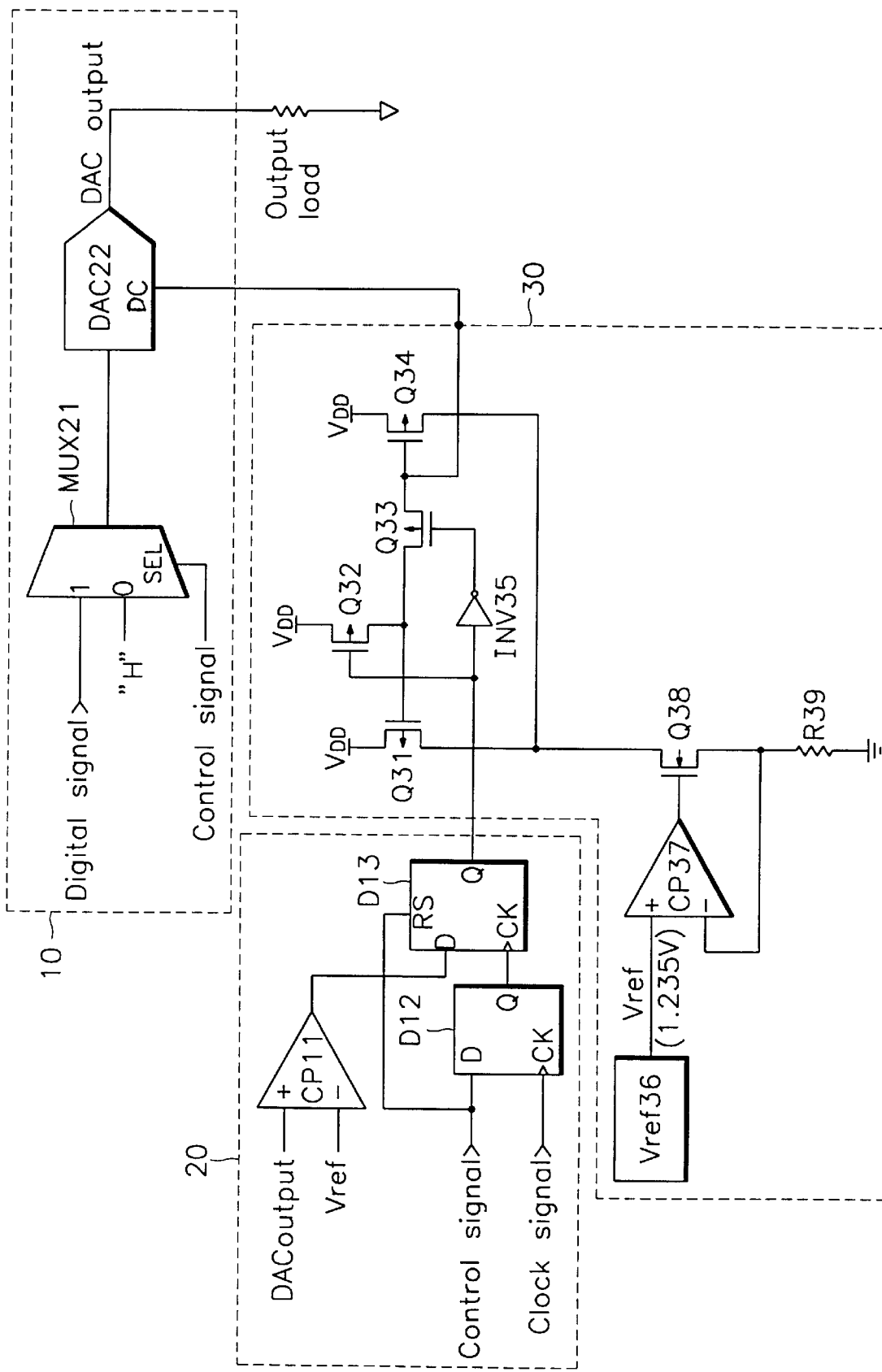
FIG. 2 is a schematic diagram of the digital-to-analog system of one embodiment of the present invention, including an apparatus for detecting an output load.

As indicated in FIG. 2, an apparatus for detecting an output load in accordance with a preferred embodiment of the present invention includes a digital-to-analog converting device 10 for converting a digital signal to an analog signal after receiving the digital signal. Also included is a load variation sensing device 20 for sensing a load variation after receiving the output signal of the digital-to-analog converting device 10. Further included is a load current varying device 30 for maintaining a constant voltage after receiving the output signal of the load variation sensing device 20.

The digital-to-analog converting device 10 includes a multiplexer MUX21 for receiving a digital signal at a first terminal "1", receiving a high level signal at a second terminal "0", and receiving a control signal at a third terminal "SEL". Also included is a digital-to-analog converter DAC22 for receiving the digital output signal of the multiplexer MUX21 and converting it to an analog signal. DAC22 also provides a DC signal to the load current varying device 30 from the terminal designated DC.

The load variation sensing device 20 includes a comparator CP11 for receiving the output voltage of the digital-to-analog converter DAC22 at a non-inverting terminal, and receiving a reference voltage $V_{ref}$ at an inverting terminal. Also included is a first D-type flip-flop D12 for receiving a control signal at a first input terminal D, and receiving a clock signal at a second input terminal CK. A second D-type flip-flop D13 is arranged to connect its input terminal CK to an output terminal Q of the first D-type flip-flop D12. The input terminal D of flip-flop D13 is connected to an output terminal of the comparator CP11, and the reset input terminal RS of D13 is connected to a control signal source (not shown).

The load current varying device 30 includes a reference voltage generator $V_{ref}$36 and a comparator CP37 for receiving an output voltage $V_{ref}$ of the reference voltage generator $V_{ref}$36 at a non-inverting terminal. A transistor Q38 is arranged to receive an output voltage of the comparator CP37 at a gate terminal. An output voltage is sent to the inverting terminal of the comparator CP37 from the source terminal of Q38. A resistor R39 is connected between the source terminal of the transistor Q38 and a ground terminal.

Transistor Q31 is arranged to receive a supply voltage $V_{DD}$ at its source terminal, and its drain terminal is connected to the drain terminal of transistor Q38. Transistor Q32 is arranged to receive the supply voltage $V_{DD}$ at its source terminal, and is connected at its gate terminal to the Q terminal of D-type flip-flop D13. The drain terminal of Q32 is connected to the gate terminal of the transistor Q31. An inverter INV35 connected at its input terminal to the gate terminal of the transistor Q32. A transistor Q33 is connected at its gate terminal to the output terminal of the inverter INV35, and connected at its source terminal to the gate terminal of the transistor Q31. A transistor Q34 receives the supply voltage $V_{DD}$ at its source terminal and is connected at its gate terminal to the drain terminal of the transistor Q33. Transistor Q34 has commonly connected gate and drain terminals, and is connected at its drain terminal to the drain terminal of the transistor Q38.

Digital-to-analog converter DAC22 outputs a current having a value determined by the specific active resistance state of transistors Q31 and Q34. The output current range of DAC 22 with respect to an output load can be varied by controlling the specific active resistance state of transistors Q31 and Q34. This is true because the combination of DAC 22, the output load, transistors Q31, Q32, Q33, Q34, Q38, inverter INV35, and resistor R39 act as a current mirror circuit. The active resistant state of load current varying device 30 is changed by the selective activation of certain transistors and the accompanying deactivation of other transistors. By selectively activating and deactivating certain transistors in current load varying circuit 30, the characteristics of the current mirror change to accommodate the two different values of output load. As a result, the required (in digital video circuits) output of one volt (peak-to-peak) can be maintained despite changes in the output load.

During normal operating conditions, the control signal to both multiplexer MUX21 and D-type flip-flop D12 is high. When this condition occurs the conversion of digital signals to analog signals is carried out by DAC22. Under normal operating conditions the reference voltage $V_{ref}$ is preferably fixed at 1.235 volts. When the control signal to RS terminal of D13 is at a high level, the output signal of flip-flop D13 is fixed at a low level irrespective of the output signal of comparator CP11, so that transistor Q32 is turned on and transistors Q31 and Q33 are turned off. As a result, when the output load is 37.5Ω, DAC22 outputs a voltage of 1V to transistor Q34.

Also, when the control signal is at a high level, comparator CP11 compares the DAC output with a reference voltage $V_{ref}$. Due to the respective difference in DAC output voltages, the comparator CP11 outputs a low level signal when the output load is 37.5Ω, and outputs a high level signal when the output load is 70Ω. However, the output of flip-flop D13 remains low due to the high level of the control signal.

If a control signal with a high level is changed to one having a low level, the comparator's output corresponding to the output load voltage of DAC22 is latched to the D input of flip-flop D13. When the output load is 37.5Ω, the output signal of flip-flop D13 is at a low level, so that a transistor Q32 is turned on and transistors Q31 and Q33 are turned off. DAC22 outputs a voltage of 1V to transistor Q34.

In contrast, when the output load is 75Ω, the output signal of flip-flop D13 is at a high level so that the transistor Q32 is turned off and transistors Q31 and Q33 are turned on. As a result, the DAC22 outputs voltage of 1V to the transistors Q31 and Q34.

In accordance with the aforementioned operation, a constant current flowing in resistor R39 changes proportionally in conjunction with current changes in the output load. Current changes in R39 are a mirror of half of the current changes in the output load. By varying the size of the transistor of the reference current source (transistors Q31 through Q34 along with inverter INV35), load current can be controlled. This allows a constant voltage of 1 volt (peak-to-peak) to be maintained.

As described above, the present invention detects the level of output load by using a comparator and a flip-flop controlled by an internal or external control signal, or a reset signal. Based upon detected output load, the invention controls the gate bias power to the transistors of a current mirror. As a result, a constant voltage of $1V_{P-P}$ is generated to the output load.

The above-mentioned effects of the present invention can be widely used in digital signal processing and outputting devices for actively controlling at least two kinds of output loads. Although a number of arrangements of this invention have been mentioned by way of example, it is not intended that the invention be limited thereto. For example, the same load detection and current control system can be used for applications other than video signal processing. Accordingly, the invention should be considered to include any and all configurations, modifications, variations, combinations, equivalent arrangements or expansions falling within the scope of the following claims.

What is claimed is:

1. A digital-to-analog conversion system arranged to detect an output load, comprising:

digital-to-analog converting means for converting a digital signal to analog signal;

load variation sensing means for sensing a load variation based upon an output signal of said digital-to-analog converting means; and load current varying means for maintaining a constant output voltage from said digital-to-analog converting means.

2. The system as defined in claim 1, wherein said digital analog converting means comprise:

a multiplexer arranged to receive a control signal and to select a digital input signal; and a digital-to-analog converter arranged to generate a fixed constant voltage to an output load.

3. The system as defined in claim 2, wherein said load variation sensing means comprise:

a comparator, having non-inverting, inverting, and output terminals, connected to receive the output signal of said digital-to-analog converter at said non-inverting terminal, and to receive a reference voltage at said inverting terminal;

a first D-type flip-flop, having input, output, and clock terminals, and connected to receive said control signal at said input terminal, a clock signal at said clock terminal; and a second D-type flip-flop, having input, output, reset, and clock terminals, where said output terminal of the first D-flip-flop is connected to said clock terminal of said second D-type flip-flop, said input terminal of said second D-type flip-flop is connected to said output terminal of said comparator, and said control signal is received at said reset terminal.

4. The system as defined in claim 3, wherein said load current varying means comprise:

a load current varying circuit arranged to receive a signal from said output terminal of said second D-type flip-flop, said load current varying circuit having a first portion activated when a first type of output load is detected by said load current variation sensing means, and a second portion activated when a second type of output load is detected by said load variation sensing means.

5. The system as defined in claim 4, wherein said load current varying means, said digital-to-analog converter and said output load comprise a current mirror.

* * * * *